(12) United States Patent
Groiss

(10) Patent No.: US 7,479,808 B2
(45) Date of Patent: Jan. 20, 2009

(54) THRESHOLD CIRCUIT ARRANGEMENT

(75) Inventor: Stefan Hermann Groiss, Villach-Landskron (AT)

(73) Assignee: Infineon Technologies AG, Munich (DE)

( * ) Notice: Subject to any disclaimer, the term of this patent is extended or adjusted under 35 U.S.C. 154(b) by 59 days.

(21) Appl. No.: 11/531,928

(22) Filed: Sep. 14, 2006

(65) Prior Publication Data

US 2008/0054948 A1    Mar. 6, 2008

(30) Foreign Application Priority Data

Aug. 31, 2006   (DE) ...................... 10 2006 040 795

(51) Int. Cl.
*H03K 5/153*    (2006.01)
(52) U.S. Cl. .......................... 327/74; 327/58
(58) Field of Classification Search .................. 327/58, 327/62, 63, 74
See application file for complete search history.

(56) References Cited

U.S. PATENT DOCUMENTS

| | | | | |
|---|---|---|---|---|
| 5,117,201 A | * | 5/1992 | Luther | 330/279 |
| 2002/0186572 A1 | * | 12/2002 | Nishida et al. | 363/21.16 |
| 2003/0198302 A1 | * | 10/2003 | Song | 375/340 |
| 2007/0253223 A1 | * | 11/2007 | Neidorff et al. | 363/2 |

* cited by examiner

*Primary Examiner*—Kenneth B Wells
*Assistant Examiner*—Ryan C Jager
(74) *Attorney, Agent, or Firm*—Dicke, Billig & Czaja, PLLC

(57) ABSTRACT

A method for operating a threshold circuit arrangement and a threshold circuit arrangement is disclosed. In one embodiment, the invention provides a threshold circuit arrangement, wherein a comparator circuit is configured to compare an input signal is compared with a predetermined threshold, and wherein, depending on the result of the comparison, an output signal is adapted to change its state. A circuit is provided for preventing the change of state of the output signal in the case of predetermined forms of the input signal.

16 Claims, 6 Drawing Sheets

THRESHOLD CIRCUIT ARRANGEMENT

CROSS-REFERENCE TO RELATED APPLICATIONS

This Utility Patent Application claims priority to German Patent Application No. DE 10 2006 040 795.4 filed on Aug. 31, 2006, which is incorporated herein by reference.

BACKGROUND

The invention relates to a threshold circuit arrangement and to a method for operating a threshold circuit arrangement.

In semiconductor devices, in particular e.g., in corresponding integrated (analog or digital) computing circuits and/or semiconductor memory devices, as well as other electric circuits or—to put it more general—signal processing systems, threshold circuit arrangements, e.g., appropriate comparators, are frequently used.

Conventional comparators may, for instance, each include one or a plurality of operational amplifiers and compare, e.g., a signal present at a plus (or minus) input of the respective comparator with a signal (threshold) present at a minus (or plus) input of the comparator.

If the signal present at the plus input of a corresponding comparator is larger than the signal present at the minus input, the respective comparator outputs a comparator output signal having a first level, in particular a logic high level, and otherwise a comparator output signal having a second level differing from the first level, in particular a logic low level.

Furthermore, comparators including a hysteresis are known, e.g., Schmitt triggers.

In the case of a Schmitt trigger—due to the hysteresis—switch on and switch off levels come apart: If the level of a signal present at an input of the Schmitt trigger rises above a first, predetermined input level value (first threshold), the Schmitt trigger outputs an output signal having a first output level, in particular a logic high level. Only when the level of the signal present at the input of the Schmitt trigger drops below a second, predetermined input level value (second threshold) that is lower than the above-mentioned first input level value, does the output level of the output signal output by the Schmitt trigger change from the above-mentioned first output level to a second level differing from the first output level (in particular to a logic low level).

Thus, it is prevented that noise-afflicted input signals result in a frequent switching of the comparator.

Conventional comparators with and without hysteresis are, for instance, described in U. Tietze, Ch. Schenk, $9^{th}$ edition 1990, pages 180-185.

The comparators known in prior art include, i.a., the disadvantage that it is not only signals that—like e.g., the first input signal ("input signal 1") illustrated in FIG. 1—rise relatively quickly and exceed a corresponding threshold relatively strongly and for a relatively long time (e.g., the threshold Ref 2 illustrated in FIG. 1) result in a switching of the comparator, but also signals that—like e.g., the second and third input signals ("input signal 2" or "input signal 3") illustrated in FIG. 1—rise relatively slowly and/or exceed the threshold Ref 2 only relatively weakly and/or for a relatively short time only.

The consequence of this is that the output signal output by the comparator (e.g., the output signal OUT illustrated in FIG. 1) possibly changes its state relatively late only (e.g., in reaction to the above-mentioned second input signal ("input signal 2") only at a point in time T2, or e.g., in reaction to the above-mentioned third input signal ("input signal 3") only at a point in time T3), i.e. afflicted with relatively strong delays and/or for a relatively short time only (e.g., with the above-mentioned second input signal ("input signal 2") only for a duration ΔT2, or e.g., with the above-mentioned third input signal ("input signal 3") only for a duration ΔT3).

For these and other reasons, there is a need for the present invention.

SUMMARY

The invention provides a threshold circuit arrangement and a method for operating a threshold circuit arrangement. In one embodiment, the invention provides a threshold circuit arrangement, wherein a comparator is configured to compare an input signal is compared with a predetermined threshold, and wherein, depending on the result of the comparison, an output signal is adapted to change its state. A circuit is provided for preventing the change of state of the output signal in the case of predetermined forms of the input signal.

In one embodiment, the circuit may be configured such that the change of state is prevented as a function of the rate of the signal rise or the signal fall of said input signal, and/or as a function of the duration (t_out, t_out', t_out''') during which the level of said input signal exceeds or under-runs the predetermined threshold, and/or as a function of the amount by which the level of said input signal exceeds or under-runs the predetermined threshold.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The invention provides a novel threshold circuit arrangement and a novel method for operating a threshold circuit arrangement, in particular a circuit arrangement and a method by means of which the above-mentioned and/or further disadvantages of conventional threshold circuit arrangements can—at least partially—be eliminated or avoided.

In accordance with one embodiment of the invention, there is provided a threshold circuit arrangement in which an input signal (IN) is compared with a predetermined threshold (Ref 2) and, depending on the result of this comparison, an output signal is adapted to change its state, wherein means is provided for preventing the change of state of the output signal in the case of predetermined forms of the input signal (IN). As predetermined forms of the input signal (IN), for instance, predetermined time courses or predetermined forms of the time course of the input signal (IN) may be used.

Thus, there may, for instance, be prevented that the output signal changes its state although the rate of the signal rise of the input signal (IN) is relatively small, and/or although the level of the input signal exceeds the predetermined threshold (Ref 2) for a relatively short duration only and/or relatively weakly only, etc.

Figure 1:
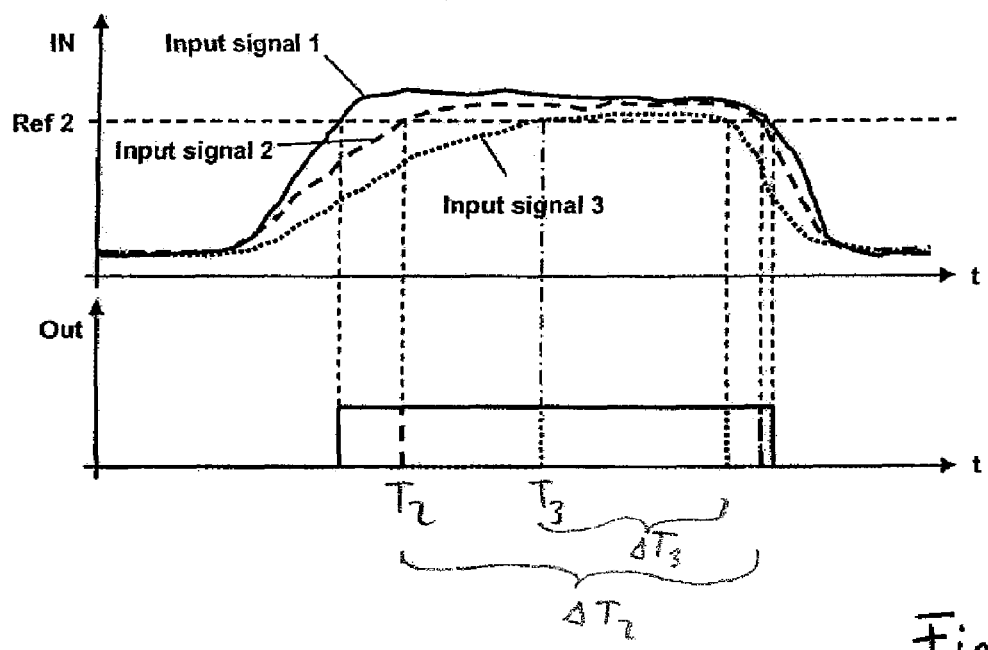
FIG. 1 illustrates a schematic, exemplary representation of the time course of a plurality of input signals that can be input into a threshold circuit arrangement, and of output signals output in reaction thereto by a conventional threshold circuit arrangement.
Figure 2:
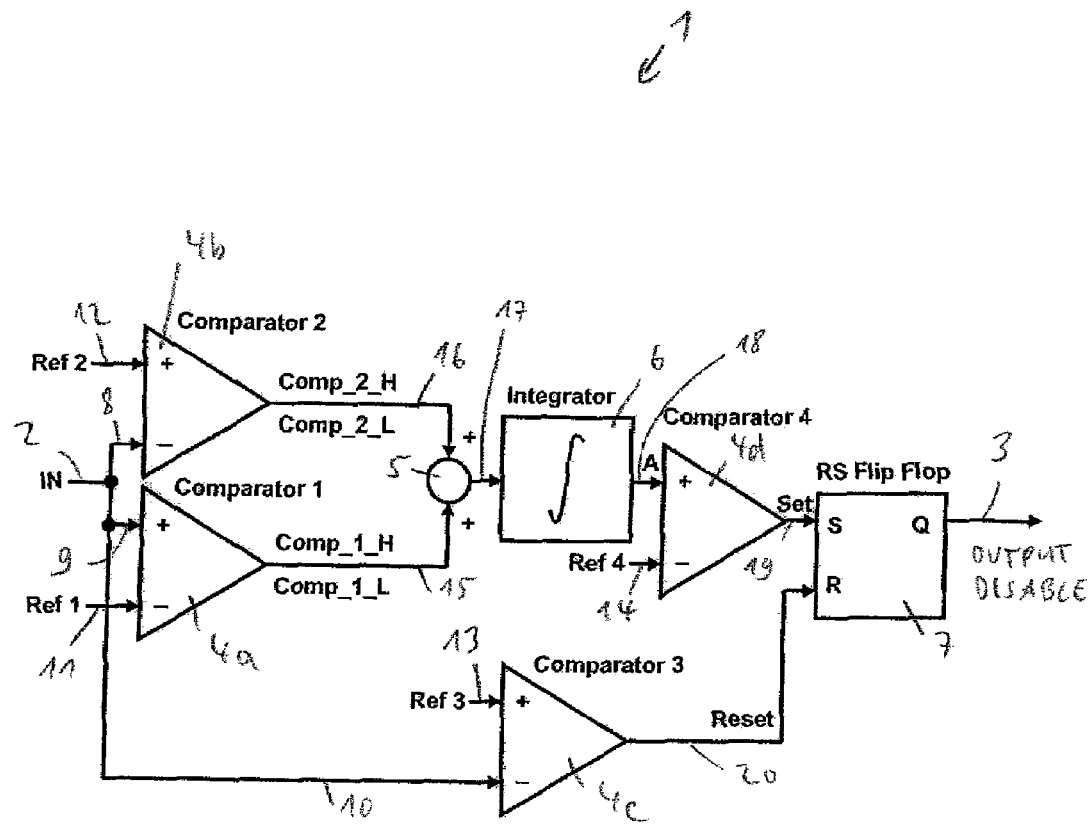
FIG. 2 illustrates a schematic, exemplary representation of a principle circuit diagram of a section of a threshold circuit arrangement in accordance with an embodiment of the present invention.

FIG. 2 illustrates—schematically and by way of example—a principle circuit diagram of a section of a threshold circuit arrangement 1 in accordance with an embodiment of the present invention, into which an electric (input) signal IN (e.g., a corresponding current or voltage signal, or a signal representing any other physical value), e.g., a corresponding sensor signal, is input via a signal line 2.

As results from FIG. 2, the circuit arrangement 1 includes a plurality of comparators 4a, 4b, 4c, 4d, and an addition element 5, an integrator 6, and a RS flip flop 7.

As comparators 4a, 4b, 4c, 4d, conventional comparators that each include, for instance, one or a plurality of corresponding operational amplifier may be used, in particular comparators 4a, 4b, 4c, 4d by means of which a signal present at a plus input of the respective comparator is compared with a signal present at a minus input of the comparator.

If the signal present at the plus input of a corresponding comparator 4a, 4b, 4c, 4d is larger than the signal present at the minus input, the respective comparator 4a, 4b, 4c, 4d outputs a comparator output signal having a first level, in particular a logic high level, and otherwise a comparator output signal having a second level differing from the first level, in particular a logic low level.

In one embodiment, for the first comparator 4a and the second comparator 4b—a comparator is used in which the above-mentioned first and second comparator output signal levels (high level and low level) each have a continuously—variably positively and/or negatively—adjustable value (Comp_2_H, Comp_2_L, or Comp_1_H, Comp_1_L).

The integrator 6 may, for instance, be a corresponding linear integrator that integrates a signal present at the input of the integrator 6 up over time, e.g., a corresponding integrator including one or a plurality of capacitors and/or one or a plurality of operational amplifiers.

As RS flip flop 7, a corresponding, conventional RS flip flop that is, for instance, built up of two corresponding, feedback NOR (or alternatively NAND) gates may be used.

The RS flip flop 7 includes two inputs, namely a S-input (set input) and a R-input (reset input), and an output Q that is connected with an output signal line 3 at which—as output signal of the threshold circuit arrangement 1—a signal OUTPUT DISABLE can be tapped (and possibly a further output/Q that is complementary to the output Q).

If the signal present at the S-input (set input) of the RS flip flop 7 has a logic high level and the signal present at the R-input (reset input) of the RS flip flop 7 a logic low level, the output signal OUTPUT DISABLE output at the output Q of the RS flip flop 7 at the signal line 3 assumes a logic high level.

Vice versa, if the signal present at the S-input (set input) of the RS flip flop 7 has a logic low level and the signal present at the R-input (reset input) of the RS flip flop 7 a logic high level, the output signal OUTPUT DISABLE output at the output Q of the RS flip flop 7 at the signal line 3 assumes a logic low level.

If both the signal present at the S-input (set input) and the signal present at the R-input (reset input) of the RS flip flop 7 have a logic low level, the old state ("memory state") is maintained with the RS flip flop 7: If the output signal OUTPUT DISABLE output at the output Q of the RS flip flop 7 at the signal line 3 was last logic low (low level), an output signal OUTPUT DISABLE with a logic low level is continued to be output; if the output signal OUTPUT DISABLE output at the output Q of the RS flip flop 7 at the signal line 3 was last logic high (high level), an output signal OUTPUT DISABLE with a logic high level is continued to be output.

As results from FIG. 2, in the threshold circuit arrangement 1 the input signal IN input via the signal line 2 is, via a signal line 8 that is connected with the signal line 2, transmitted to a minus input of the second comparator 4b and, via a signal line 9 that is connected with the signal line 2, to a plus input of the first comparator 4a, and via a signal line 10 that is connected with the signal line 2, to a minus input of the third comparator 4c.

As results further from FIG. 2, a (constant) reference signal Ref1 is applied to a minus input of the first comparator 4a via a signal line 11.

Correspondingly similar, a further (constant) reference signal Ref 2 is applied to a plus input of the second comparator 4b via a signal line 12, an additional (constant) reference signal Ref 3 to a plus input of the third comparator 4c via a signal line 13, and a fourth (likewise constant) reference signal Ref 4 to a minus input of the fourth comparator 4d via a signal line 14.

The values of the levels of the reference signals Ref 1, Ref 2, Ref 3, Ref 4 are adapted to the expected level value of the input signal IN.

In accordance with FIG. 2, the first comparator 4a compares the signal IN present at the plus input thereof with the signal Ref 1 present at the minus input thereof.

If the signal IN present at the plus input of the comparator 4a is larger than the signal Ref 1 at the minus input, the first comparator 4a outputs, at a signal line 15, a signal including the above-mentioned high level Comp_1_H, and otherwise a signal including the above-mentioned low level Comp_1_L.

Correspondingly similar, the second comparator 4b compares the signal Ref 2 present at the plus input thereof with the signal IN present at the minus input thereof.

If the signal Ref 2 present at the plus input of the comparator 4b is larger than the signal IN present at the minus input thereof, the second comparator 4b outputs, at a signal line 16, a signal including the above-mentioned logic high level Comp_2_H. and otherwise a signal including the above-mentioned logic low level Comp_2_L.

The logic high level Comp_1_H of the signal output by the first comparator 4a at the signal line 15 is larger or of a larger amount, respectively, than the logic low level Comp_2_L of the signal output by the second comparator 4b at the signal line 16.

The signals output by the first and second comparators 4a, 4b at the signal lines 15, 16 are fed to the addition element 5.

In the addition element 5, the signals output by the first and second comparators 4a, 4b at the signal lines 15, 16 are added, and the resulting added signal (that includes a level corresponding to the sum of the levels of the signals present at the signal lines 15, 16) is output by the addition element 5 at a signal line 17 and fed to the input of the integrator 6 via this line.

In the integrator 6, the signal present at the signal line 17 and output by the addition element 5 is integrated up over time, and the resulting signal A is fed to the plus input of the fourth comparator 4d via a signal line 18.

In accordance with FIG. 2, the fourth comparator 4d compares the signal A present at the plus input thereof with the signal Ref 4 present at the minus input thereof.

If the signal A present at the plus input of the comparator 4d is larger than the signal Ref 4 present at the minus input, the fourth comparator 4d outputs, at a signal line 19, a signal Set including the above-mentioned logic high level, and otherwise a signal Set including the above-mentioned logic low level.

As results further from FIG. 2, the third comparator 4c compares the signal Ref 3 present at the plus input thereof with the signal IN present at the minus input thereof.

If the signal Ref 3 present at the plus input of the comparator 4c is larger than the signal IN present at the minus input, the third comparator 4c outputs, at a signal line 20, a signal Reset including the above-mentioned logic high level, and otherwise a signal Reset including the above-mentioned logic low level.

The signal Reset output by the third comparator 4c at the signal line 20 is fed to the above-mentioned R-input of the RS flip flop 7, and the signal Set output by the fourth comparator 4d at the signal line 19 is fed to the above-mentioned S-input of the RS flip flop 7.

The signal OUTPUT DISABLE present at the output Q of the RS flip flop 7, i.e. at the signal line 3, is fed to a total output comparator (not illustrated). If the signal OUTPUT DISABLE fed to the total output comparator via the signal line 3 includes a logic low level, the total output comparator is enabled or in a non-locked state, respectively; if the signal OUTPUT DISABLE fed to the total output comparator via the signal line 3 includes a logic high level, the total output comparator is disabled or in a locked state, respectively.

As total output comparator, a conventional comparator including, for instance, one or a plurality of corresponding operational amplifiers (with or without hysteresis) may be used, in particular a comparator by means of which a signal present at a plus input of the comparator—here e.g., the above-mentioned input signal IN present at the signal line 2—is compared with a signal present at a minus input of the comparator—here: e.g., the above-mentioned reference signal Ref 2 present at the signal line 12.

If the input signal IN present at the plus input of the total output comparator is larger than the signal Ref 2 present at the minus input, and if the total output comparator is enabled or in a non-locked state, respectively, the total output comparator outputs a total output comparator output signal OUT including a first level, in particular a logic high level, and otherwise (i.e. if the input signal IN present at the plus input of the total output comparator is not larger than the signal Ref 2 present at the minus input, or if the total output comparator is disabled or in a locked state, respectively (or both)), a total output comparator output signal OUT including a second level differing from the first level, in particular a logic low level is output.

FIGS. 3 to 6 each illustrate schematic, exemplary representations of the time course of various input signals IN that can be input into the threshold circuit arrangement 1 illustrated in FIG. 2 via the signal line 2, and of various further signals occurring in the threshold circuit arrangement 1 in reaction thereto.

As results from FIGS. 3 to 6, in the threshold circuit arrangement 1 the level of the signal Ref 2 present at the signal line 12, i.e. at the plus input of the second comparator 4b, may be larger than the level of the signal Ref 1 present at the signal line 11, i.e. at the minus input of the first comparator 4a. Furthermore—as also results from FIGS. 3 to 6—the level of the signal Ref 1 present at the signal line 11, i.e. at the minus input of the first comparator 4a, may be larger than the level of the signal Ref 3 present at the signal line 13 (and the level of the signal Ref 4 present at the signal line 14, i.e. at the minus input of the fourth comparator 4d (and the level of the signal Ref 4 present at the signal line 14, i.e. at the minus input of the fourth comparator 4d, may be larger than the level of the signal Ref 3 present at the signal line 13, i.e. at the plus input of the third comparator 4c)).

Figure 3:
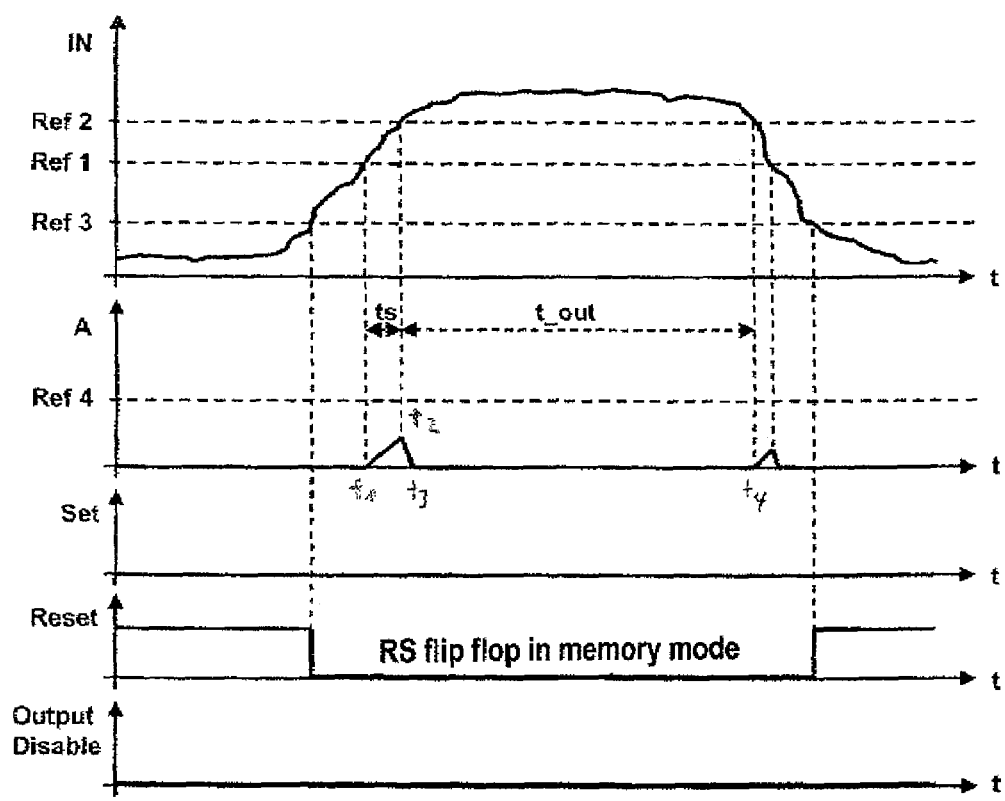
FIG. 3 illustrates a schematic, exemplary representation of the time course of a first input signal that can be input into the threshold circuit arrangement illustrated in FIG. 2, and of various further signals occurring in the threshold circuit arrangement in reaction thereto.

FIG. 3 illustrates a schematic, exemplary representation of the time course of a first input signal IN that can be input into the threshold circuit arrangement 1 illustrated in FIG. 2 via the signal line 2, and of various further signals occurring in the threshold circuit arrangement 1 in reaction thereto, wherein the input signal IN illustrated in FIG. 3 rises sufficiently quickly and exceeds the level of the above-mentioned signal Ref 2 (threshold Ref 2) present at the signal line 12, i.e. at the plus input of the second comparator 4b, sufficiently strongly and for a sufficiently long time.

As results from FIG. 3, the level of the input signal IN fed to the plus input of the first comparator 4a via the signal lines 2, 9 exceeds, from a point in time t1, the level of the reference signal Ref 1 fed to the minus input of the first comparator 4a via the signal line 11. As has already been indicated above, the first comparator 4a thus outputs, from the point in time t1, a signal including the above-mentioned high level Comp_1_H at the signal line 15.

As results further from FIG. 3, the level of the input signal IN fed to the minus input of the second comparator 4b via the signal lines 2, 8 exceeds, contrary thereto, the level of the reference signal Ref 2 fed to the plus input of the second comparator 4b via the signal line 12 from a point in time t2 only—i.e. here due to the relatively quick rise of the input signal IN a relatively short duration ts after the point in time t1. As has already been indicated above, the second comparator 4b thus outputs, at the above-mentioned point in time t1 and until the above-mentioned point in time t2, a signal including the above-mentioned logic high level Comp_2_H at the signal line 16, and only from the point in time t2 a signal including the above-mentioned logic low level Comp_2_L.

Since, as already indicated above, the logic high level Comp_1_H of the signal output by the first comparator 4a at the signal line 15 is larger or has a larger amount, respectively, than the logic low level Comp_2_L of the signal output by the second comparator 4b at the signal line 16 (wherein the logic high level Comp_1_H may, for instance, be positive and the logic low level Comp_2_L may, for instance, be negative), a positive signal is present at the signal line 17, i.e. at the output of the addition element 5, or at the input of the integrator 6, respectively, from the above-mentioned point in time t1 until the above-mentioned point in time t2.

Due to the above-mentioned integration procedure performed by the integrator 6, the signal A output at the output of the integrator 6 at the signal line 18 continues to increase (linearly) in reaction thereto from the point in time t1 (e.g., since the above-mentioned capacitor(s) provided in the integrator 6 continue to be charged).

As has already mentioned above, the second comparator 4b outputs, from the above-mentioned point in time t2, a signal including the logic low level Comp_2_L at the signal line 16.

Advantageously, the logic low level Comp_2_L of the signal output by the second comparator 4b at the signal line 16 may be smaller or have a smaller amount, respectively, than the logic low level Comp_1_L of the signal output by the first comparator 4a at the signal line 15. From the above-mentioned point in time t2, a negative signal will then be present at the signal line 17, i.e. at the output of the addition element 5, or at the input of the integrator 6, respectively.

Due to the above-mentioned integration procedure performed by the integrator 6, the signal A output at the output of the integrator 6 at the signal line 18 continues to decrease (linearly) in reaction thereto (until a point in time t3 at which e.g., the capacitor(s) provided in the integrator 6 has/have been fully discharged).

The signal A output at the signal line 18 of the integrator 6 thus includes—as results also from FIG. 3—a substantially triangular signal course.

Due to the above-mentioned relatively short duration ts during which the input signal IN present at the signal line 2 is indeed already larger than the reference signal Ref 1 present at the signal line 11, but still smaller than the reference signal Ref 2 present at the signal line 12, in the example illustrated in FIG. 3, the level of the signal A output by the integrator 6 at the signal line 18 remains always smaller than the level of the reference signal Ref 4 present at the signal line 14.

Consequently, in the example illustrated in FIG. 3, the signal output by the fourth comparator 4d at the signal line 19 and fed to the S-input (Set input) remains on the above-mentioned logic low level, i.e. the RS flip flop 7 is not set.

The signal OUTPUT DISABLE present at the output Q of the RS flip flop 7, i.e. at the signal line 3, thus remains on the above-mentioned logic low level, and the above-mentioned total output comparator always remains enabled or in the above-mentioned non-locked state, respectively.

As soon as the input signal IN present at the plus input of the total output comparator gets larger than the signal Ref 2 present at the minus input (in FIG. 3 at the above-mentioned point in time t2), the total output comparator output signal OUT output by the total output comparator thus changes from the above-mentioned logic low level to the above-mentioned logic high level.

As results further from FIG. 3, with the signal course illustrated in FIG. 3, the total output comparator output signal OUT output by the total output comparator changes from the above-mentioned logic high level back to the above-mentioned logic low level at a point in time t4 only (i.e. a relatively long duration t_out after the above-mentioned point in time t2)—namely when the input signal IN present at the plus input of the total output comparator gets smaller again than the signal Ref 2 present at the minus input; during the entire duration t_out the total output comparator remains enabled or in the above-mentioned non-locked state, respectively.

Figure 4:
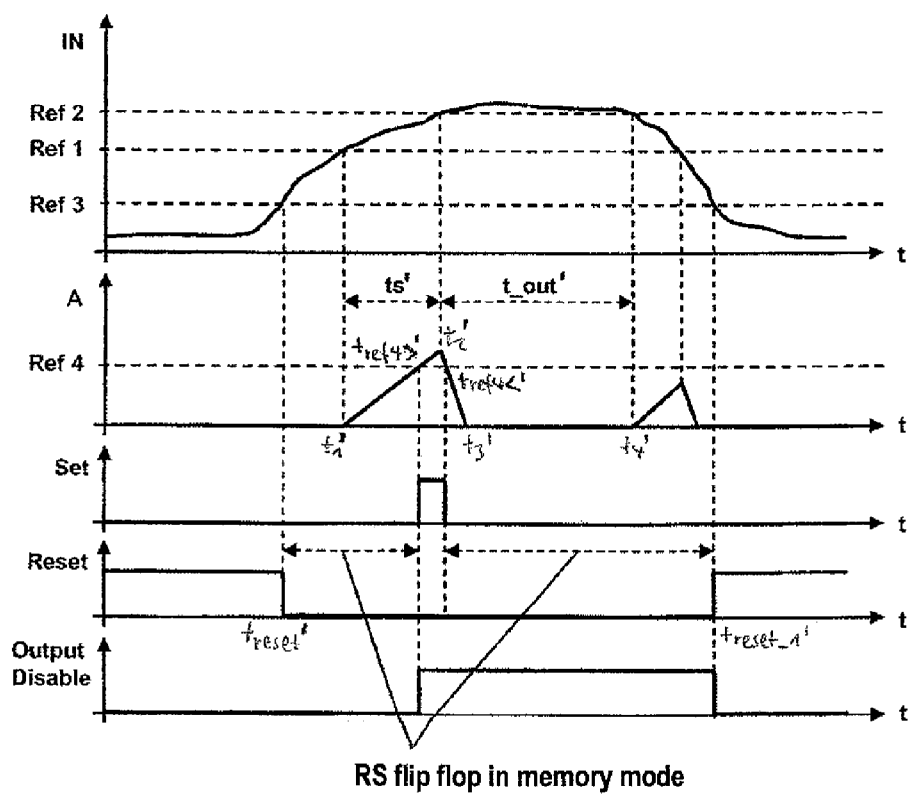
FIG. 4 illustrates a schematic, exemplary representation of the time course of a second, different input signal that can be input into the threshold circuit arrangement illustrated in FIG. 2, and of various further signals occurring in the threshold circuit arrangement in reaction thereto.

FIG. 4 illustrates a schematic, exemplary representation of the time course of a second input signal IN that can be input into the threshold circuit arrangement 1 illustrated in FIG. 2 via the signal line 2, and of various further signals occurring in the threshold circuit arrangement 1 in reaction thereto, wherein the input signal IN illustrated in FIG. 4 has a relatively slow rising rate.

As results from FIG. 4, the level of the input signal IN fed to the minus input of the third comparator 4c via the signal lines 2, 10 exceeds the level of the reference signal Ref 3 fed to the plus input of the third comparator 4c via the signal line 13 from a point in time treset'. Thus, from the point in time treset', the third comparator 4c outputs a signal including the above-mentioned logic low level at the signal line 20, and the signal is fed to the R-input (Reset input) of the RS flip flop 7.

As results further from FIG. 4, the level of the input signal IN fed to the plus input of the first comparator via the signal lines 2, 9 exceeds, from a point in time t1', the level of the reference signal Ref 1 fed to the minus input of the first comparator 4a via the signal line 11. As has already been indicated above, a signal including the above-mentioned logic high level Comp_1_H is thus output by the first comparator 4a at the signal line 15 from the point in time t1'.

As results further from FIG. 4, contrary thereto, the level of the input signal IN fed to the minus input of the second comparator 4b via the signal lines 2, 8 exceeds the level of the reference signal Ref 2 fed to the plus input of the second comparator 4b via the signal line 12 from a point in time t2' only—i.e. here due to the relatively slow rise of the input signal IN a relatively long duration ts' after the point in time t1'. As has already been indicated above, the second comparator 4b thus outputs, at the above-mentioned point in time t1' until the above-mentioned point in time t2', a signal including the above-mentioned logic high level Comp_2_H at the signal line 16, and only from the point in time t2' a signal including the above-mentioned logic low level Comp_2_L.

Since, as already indicated above, the logic high level Comp_2_H of the signal output by the second comparator 4b at the signal line 16 is larger or has a larger amount, respectively, than the logic low level Comp_1_L of the signal output by the first comparator 4a at the signal line 15, a positive signal is present at the signal line 17, i.e. at the output of the addition element 5, or at the input of the integrator 6, respectively, from the above-mentioned point in time t1' until the above-mentioned point in time t2'—i.e. for the above-mentioned relatively long duration ts'.

Due to the above-mentioned integration procedure performed by the integrator 6, the signal A output at the output of the integrator 6 at the signal line 18 continues to increase (linearly) in reaction thereto from the point in time t1'.

As has already been mentioned above, from the above-mentioned point in time t2', the second comparator 4b outputs a signal including the above-mentioned logic low level Comp_2_L at the signal line 16.

In correspondence to what has been explained above, a negative signal will then be present at the signal line 17, i.e. at the output of the addition element 5, or at the input of the integrator 6, respectively, from the above-mentioned point in time t2'.

Due to the above-mentioned integration procedure performed by the integrator 6, the signal A output at the output of the integrator 6 at the signal line 18 continues to decrease (linearly) in reaction thereto (until a point in time t3' at which e.g., the capacitor(s) provided in the integrator 6 has/have been fully discharged).

The signal A output at the signal line 18 of the integrator 6 thus includes—as also results from FIG. 4—substantially triangular signal course.

Due to the above-mentioned relatively long duration ts' during which the input signal IN present at the signal line 2 is indeed already larger than the reference signal Ref 1 present at the signal line 11, but still smaller than the reference signal Ref 2 present at the signal line 12, in the example illustrated in FIG. 4, the level of the signal A output by the integrator 6 at the signal line 18 exceeds, at a point in time tref4>', the level of the reference signal Ref 4 present at the signal line 14.

Consequently, in the example illustrated in FIG. 4, the signal output by the fourth comparator 4d at the signal line 19 and fed to the S-input (Set input) of the RS flip flop 7 changes, at the above-mentioned point in time tref4>', from the above-mentioned logic low level to the above-mentioned logic high level, i.e. the RS flip flop 7 is set at the point in time tref4>'.

The signal OUTPUT DISABLE present at the output Q of the RS flip flop 7, i.e. at the signal line 3, thus changes, at the point in time tref4>', from the above-mentioned logic low level to the above-mentioned logic high level, this causing the above-mentioned total output comparator to be disabled or to be placed in the above-mentioned locked state, respectively.

Directly prior to the point in time tref>4', the RS flip flop 7 is in the above-mentioned "memory state" or "memory mode", respectively, since, as explained above, both the signal present at the S-input (Set input) thereof and the signal present at the R-input (Reset input) thereof include a logic low level then.

If, in the example illustrated in FIG. 4, the level of the signal A output by the integrator 6 at the signal line 18 again under-runs (here: at a point in time tref4<' following relatively shortly after the point in time tref4>') the level of the reference signal Ref 4 present at the signal line 14, the signal output by the fourth comparator 4d at the signal line 19 and fed to the S-input (Set input) of the RS flip flop 7 again changes back to the above-mentioned logic low level.

The signal OUTPUT DISABLE present at the output Q of the RS flip flop 7, i.e. at the signal line 3, then remains on the above-mentioned logic high level since, as explained above, the signal present at the R-input (Reset input) of the RS flip flop 7 is still on the logic low level—in other words, the RS flip flop 7 is thus, from the above-mentioned point in time tref4<', again placed in the above-mentioned "memory state" or "memory mode", respectively.

As results from FIG. 4, the RS flip flop 7 only leaves the newly assumed "memory state" or "memory mode", respectively, during which a signal OUTPUT DISABLE including the above-mentioned logic high level is output by the RS flip flop 7 at the signal line 3, when, at a point in time treset_1', the level of the input signal IN fed to the minus input of the third comparator 4c via the signal lines 2, 10 again lies below the level of the reference signal Ref 3 fed to the plus input of the third comparator 4c via the signal line 13 (since, from this point in time treset_1', the third comparator 4c again outputs a signal including the above-mentioned logic high level at the signal line 20, and the signal is fed to the R-input (Reset input) of the RS flip flop 7)—the RS flip flop 7 is then reset again.

During the entire duration t_out' during which the input signal IN present at the plus input of the total output comparator is larger than the signal Ref 2 present at the minus input (i.e. from the above-mentioned point in time t2' until a point in time t4'), the total output comparator thus remains in the above-mentioned disabled or locked state.

The total output comparator output signal OUT output by the total output comparator thus always includes, with the signal course illustrated in FIG. 4, the above-mentioned logic low level (disabled output signal state).

Figure 5:
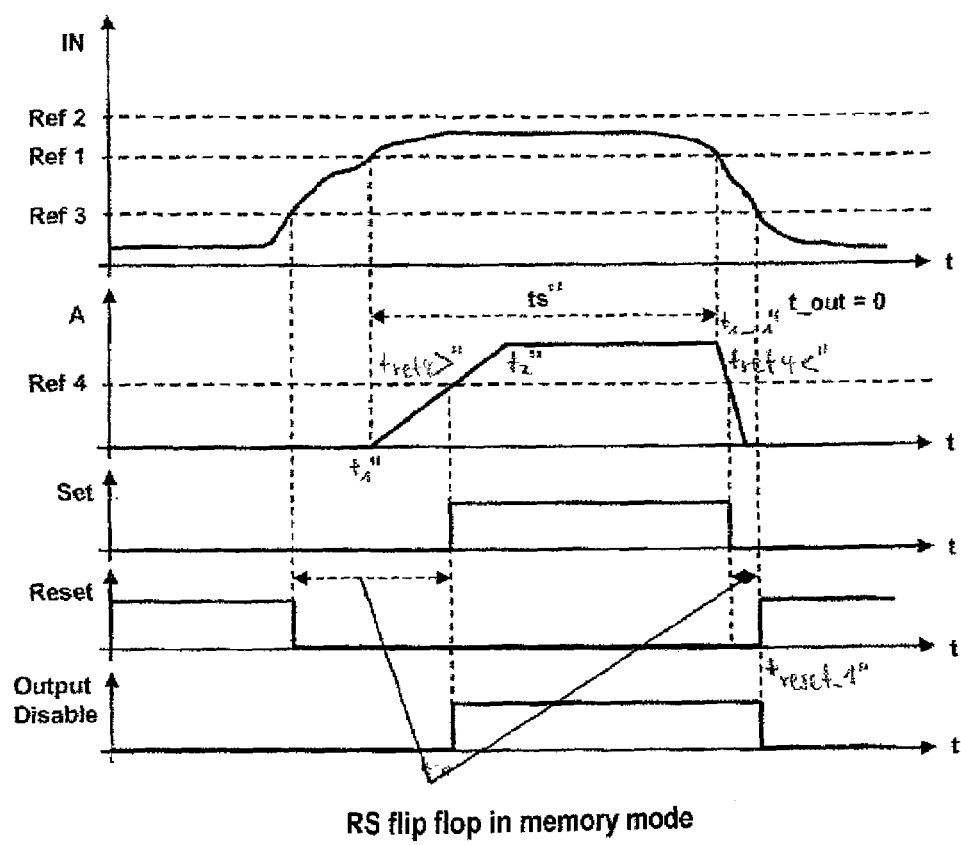
FIG. 5 illustrates a schematic, exemplary representation of the time course of a third, different input signal that can be input into the threshold circuit arrangement illustrated in FIG. 2, and of various further signals occurring in the threshold circuit arrangement in reaction thereto.

The corresponding also applies if, as is illustrated in FIG. 5, the level of an input signal IN that can be input into the threshold circuit arrangement 1 illustrated in FIG. 2 via the signal line 2 always lies below the level of the reference signal Ref 2 input into the threshold circuit arrangement 1 via the signal line 12.

As results from FIG. 5, the level of the input signal IN fed to the plus input of the first comparator 4a via the signal lines 2, 9 exceeds, from a point in time t1", the level of the reference signal Ref 1 fed to the minus input of the first comparator 4a via the signal line 11. As has already been indicated above, the first comparator 4a thus outputs, from the point in time t1", a signal including the above-mentioned logic high level Comp_1_H at the signal line 15 (and the second comparator 4b further on outputs a signal including the above-mentioned logic high level Comp_2_H at the signal line 16).

Since, as already indicated above, the logic low level Comp_1_L of the signal output by the first comparator 4a at the signal line 15 is smaller or has a smaller amount, respectively, than the logic high level Comp_2_H of the signal output by the second comparator 4b at the signal line 16, a positive signal is, from the above-mentioned point in time t1", present at the signal line 17, i.e. at the output of the addition element 5, or at the input of the integrator 6, respectively.

Due to the above-mentioned integration procedure performed by the integrator 6, the signal A output at the output of the integrator 6 at the signal line 18 continues to increase (linearly) in reaction thereto.

Since the above-mentioned input signal IN is always below the level of the reference signal Ref 2, and since thus, in the example illustrated in FIG. 5, the second comparator 4b always outputs a signal including the above-mentioned logic high level Comp_2_H at the signal line 16, the signal A output at the output of the integrator 6 at the signal line 18 continues to increase until the integrator 6—here: approx. at a point in time t2"—arrives at its upper saturation (that is available with every real integrator). The level of the signal A output at the output of the integrator 6 thus remains substantially constant from the point in time t2".

As results from FIG. 5, the level of the signal A output by the integrator 6 at the signal line 18 exceeds, from a point in time tref4>", the level of the reference signal Ref 4 present at the signal line 14.

Consequently, in the example illustrated in FIG. 5, the signal output by the fourth comparator 4d at the signal line 19 and fed to the S-input (Set input) of the RS flip flop 7 changes, at the above-mentioned point in time tref4>", from the above-mentioned logic low level to the above-mentioned logic high level, i.e. the RS flip flop 7 is set at the point in time tref4>".

The signal OUTPUT DISABLE present at the output Q of the RS flip flop 7, i.e. at the signal line 3, thus changes, at the point in time tref4>", from the above-mentioned logic low level to the above-mentioned logic high level, this causing the above-mentioned total output comparator to be disabled or to be placed in the above-mentioned locked state, respectively.

Directly prior to the point in time tref>4", the RS flip flop 7 is in the above-mentioned "memory state" or "memory mode", respectively, since then, correspondingly as explained above with reference to FIG. 4, both the signal present at the S-input (Set input) thereof and the signal present at the R-input (Reset input) thereof include a logic low level.

As results further from FIG. 5, the level of the input signal IN fed to the plus input of the first comparator 4a via the signal lines 2, 9 under-runs, from a point in time t1_1", the level of the reference signal Ref 1 fed to the minus input of the first comparator 4a via the signal line 11. Thus, from the point in time t1_1", the first comparator 4a again outputs a signal including the above-mentioned logic low level Comp_1_L at the signal line 15 (and the second comparator 4b further on outputs a signal including the logic high level Comp_2_H at the signal line 16).

This results in that, from the point in time t1_1", the signal A output by the integrator 6 at the signal line 18 decreases again.

If, in the example illustrated in FIG. 5, the level of the signal A output by the integrator 6 at the signal line 18 again under-runs (here: at a point in time tref4<" following relatively long after the point in time tref4>") the level of the signal Ref 4 present at the signal line 14, the signal output by the fourth comparator 4d at the signal line 19 and fed to the S-input (Set input) of the RS flip flop 7 again changes back to the above-mentioned logic low level.

The signal OUTPUT DISABLE present at the output Q of the RS flip flop 7 then first remains on the above-mentioned logic high level since, as explained above, the signal present at the R-input (Reset input) of the RS flip flop 7 is still on the logic low level—in other words, the RS flip flop 7 is, from the above-mentioned point in time tref4<", thus again placed in the above-mentioned "memory state" or "memory mode", respectively.

As results from FIG. 5, the RS flip flop 7 leaves the fresh "memory state" or "memory mode", respectively, during which a signal OUTPUT DISABLE including the above-mentioned logic high level is output by the RS flip flop 7 at the signal line 3, as soon as, at a point in time treset_1", the level of the input signal IN fed to the minus input of the third comparator 4c via the signal lines 2, 10 again lies below the level of the reference signal Ref 3 fed to the plus input of the third comparator 4c via the signal line 13 (since from this point in time treset_1" the third comparator 4c again outputs a signal including the above-mentioned logic high level at the signal line 20, and the signal is fed to the R-input (Reset input) of the RS flip flop 7)—the RS flip flop 7 is then reset again.

Thus, from the above-mentioned point in time tref4>" until the above-mentioned point in time treset_1", the total output comparator is disabled or locked, respectively, although the level of the input signal IN input into the threshold circuit arrangement 1 illustrated in FIG. 2 via the signal line 2 is always below the level of the reference signal Ref 2 input into the threshold circuit arrangement 1 via the signal line 12.

The total output comparator output signal OUT output by the total output comparator thus has, with the signal course illustrated in FIG. 5, always the above-mentioned logic low level (disabled output signal state).

Figure 6:
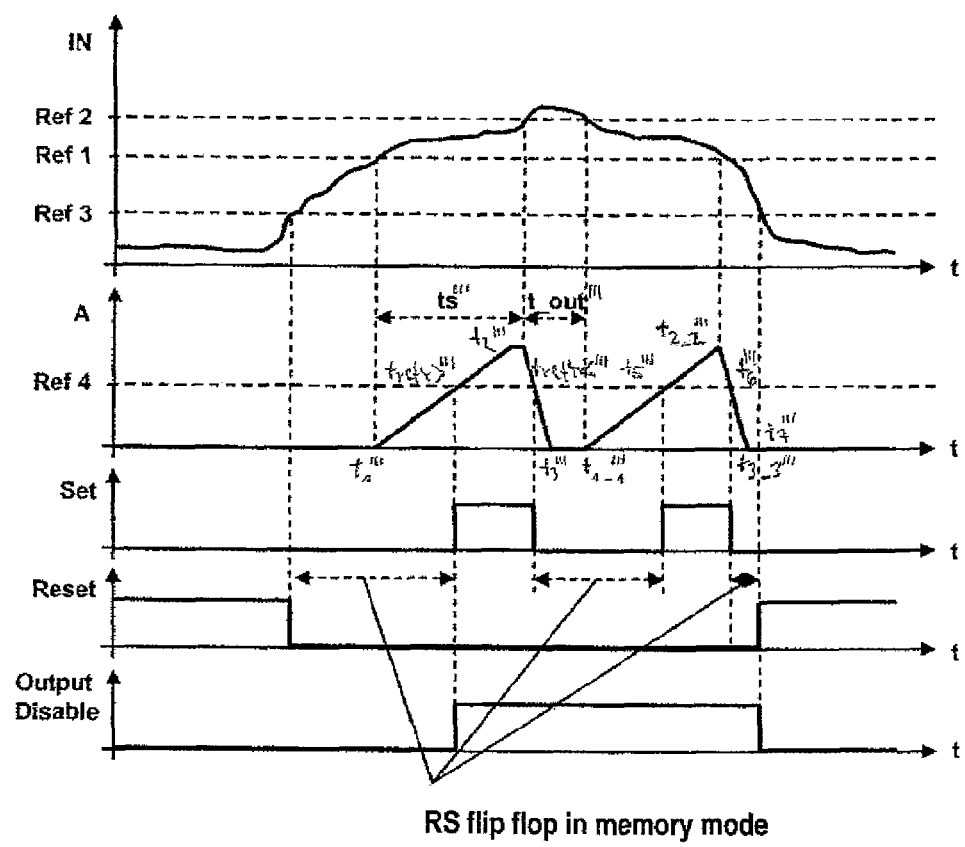
FIG. 6 illustrates a schematic, exemplary representation of the time course of a fourth, different input signal that can be input into the threshold circuit arrangement illustrated in FIG. 2, and of various further signals occurring in the threshold circuit arrangement in reaction thereto.

The corresponding also applies if, as is illustrated in FIG. 6, the level of an input signal IN that can be input into the threshold value circuit arrangement 1 illustrated in FIG. 2 via the signal line 2 lies for a relatively short period only (here: for a duration t_out''') above the level of the reference signal Ref 2 input into the threshold circuit arrangement 1 via the signal line 12.

As results from FIG. 6, the level of the input signal IN fed to the plus input of the first comparator 4a via the signal lines 2, 9 exceeds, from a point in time t1''', the level of the reference signal Ref 1 fed to the minus input of the first comparator 4a. As has already been indicated above, the first comparator 4a thus outputs, from the point in time t1''', a signal including the above-mentioned logic high level Comp_1_H at the signal line 15 (and the second comparator 4b further on outputs a signal including the above-mentioned logic high level Comp_2_H at the signal line 16).

Thus, from above-mentioned the point in time t1''', a positive signal is present at the signal line 17, i.e. at the output of the addition element 5, or at the input of the integrator 6, respectively.

Due to the above-mentioned integration procedure performed by the integrator 6, the signal A output at the output of the integrator 6 at the signal line 18 continues to increase (linearly) in reaction thereto.

Correspondingly as explained above, for instance, with reference to FIG. 4, from a point in time t2''', the second comparator 4b outputs a signal including the above-mentioned logic low level Comp_2_L at the signal line 16.

Correspondingly as explained above, from the above-mentioned point in time t2''', a negative signal will then be present at the signal line 17, i.e. at the output of the addition element 5, or at the input of the integrator 6, respectively.

Due to the above-mentioned integration procedure performed by the integrator 6, the signal A output at the output of the integrator 6 at the signal line 18 is continued to be decreased (linearly) in reaction thereto (until a point in time t3''' at which, for instance, the capacitor(s) provided in the integrator 6 has/have been fully discharged).

As results from FIG. 6, the level of the signal A output by the integrator 6 at the signal line 18 exceeds, from a point in time tref4>''', the level of the reference signal Ref 4 present at the signal line 14.

Consequently, in the example illustrated in FIG. 6, the signal output by the fourth comparator 4d at the signal line 19 and fed to the S-input (Set input) of the RS flip flop 7 changes, at the above-mentioned point in time tref4>''', from the above-mentioned logic low level to the above-mentioned logic high level, i.e. the RS flip flop 7 is set at the point in time tref4>'''.

The signal OUTPUT DISABLE present at the output Q of the RS flip flop 7, i.e. at the signal line 3, thus changes, at the point in time tref4>''', from the above-mentioned logic low level to the above-mentioned logic high level, this causing the above-mentioned total output comparator to be disabled or to be placed in the above-mentioned locked state, respectively.

Directly prior to the point in time tref>4''', the RS flip flop 7 is in the above-mentioned "memory state" or "memory mode", respectively, since then, correspondingly as explained above with respect to FIG. 4, both the signal present at the S-input (Set input) thereof and the signal present at the R input (Reset input) thereof include a logic low level.

If, in the example illustrated in FIG. 6, the level of the signal A output by the integrator 6 at the signal line 18 again under-runs (here: at a point in time tref4<''' following the point in time tref4>''') the level of the reference signal Ref 4 present at the signal line 14, the signal output by the fourth comparator 4d at the signal line 19 and fed to the S-input (Set input) of the RS flip flop 7 again changes back to the above-mentioned logic low level.

The signal OUTPUT DISABLE present at the output Q of the RS flip flop 7, i.e. at the signal line 3, then first remains on the above-mentioned logic high level since, as explained above, the signal present at the R-input (Reset input) of the RS flip flop 7 is still on the logic low level—in other words, the RS flip flop 7 is, from the above-mentioned point in time tref4<''', again placed in the above-mentioned "memory state" or "memory mode", respectively.

As results from FIG. 6, the level of the input signal IN fed to the minus input of the second comparator 4b via the signal lines 2, 8 under-runs, from a point in time t1_1''', the level of the reference signal Ref 2 fed to the plus input of the second comparator 4b via the signal line 12. As has already been indicated above, thus, from the point in time t1_1''', the second comparator 4b again outputs a signal including the above-mentioned logic high level Comp_2_H at the signal line 16 (and the first comparator 4a further on outputs a signal including the above-mentioned logic high level Comp_1_H at the signal line 15).

Correspondingly as explained above, from the above-mentioned point in time t1_1''', a positive signal will again be present at the signal line 17, i.e. at the output of the addition element 5, or at the input of the integrator 6, respectively.

Due to the above-mentioned integration procedure performed by the integrator 6, the signal A output at the output of the integrator 6 at the signal line 18 again continues to increase (linearly) in reaction thereto.

As results from FIG. 6, the level of the input signal IN fed to the plus input of the first comparator 4a via the signal lines 2, 9 under-runs, from a point in time t2_2''', the level of the reference signal Ref 1 fed to the minus input of the first comparator 4a via the signal line 11. As has already been indicated above, thus, from the point in time t2_2''', the first comparator 4a again outputs a signal including the above-mentioned logic low level Comp_1_L at the signal line 15 (and the second comparator 4b further on outputs a signal including the above-mentioned logic high level Comp_2_H at the signal line 16).

Correspondingly as explained above, from the above-mentioned point in time t2_2''', a negative signal will then be present at the signal line 17, i.e. at the output of the addition element 5, or at the input of the integrator 6, respectively.

Due to the above-mentioned integration procedure performed by the integrator 6, the signal A output at the output of the integrator 6 at the signal line 18 continues to decrease (linearly) in reaction thereto (until a point in time t3_3''' at which, for instance, the capacitor(s) provided in the integrator 6 has/have been fully discharged).

As results from FIG. 6, the level of the signal A output by the integrator 6 at the signal line 18 again exceeds, from a point in time t5''', the level of the reference signal Ref 4 present at the signal line 14.

Consequently, in the example illustrated in FIG. 6, the signal output by the fourth comparator 4d at the signal line 19 and fed to the S-input (Set input) of the RS flip flop 7 again changes, at the above-mentioned point in time t5''', from the above-mentioned logic low level to the above-mentioned logic high level, i.e. the RS flip flop 7 is again set at the point in time t5'''.

Directly prior to the point in time t5''', the RS flip flop 7 is in the above-mentioned "memory state" or "memory mode", respectively, as explained above.

The signal OUTPUT DISABLE present at the output Q of the RS flip flop 7, i.e. at the signal line 3, thus remains on the above-mentioned logic high level, this causing the above-mentioned total output comparator to remain disabled or locked, respectively.

If, in the example illustrated in FIG. 6, the level of the signal A output by the integrator 6 at the signal line 18 again under-runs (here: at a point in time t6''' following the point in time t5''') the level of the reference signal Ref 4 present at the signal line 14, the signal output by the fourth comparator 4d at the signal line 19 and fed to the S-input (Set input) of the RS flip flop 7 again changes back to the above-mentioned logic low level.

The signal OUTPUT DISABLE present at the output Q of the RS flip flop 7 then first remains on the above-mentioned logic high level since, as explained above, the signal present at the R-input (Reset input) of the RS flip flop 7 is still on the logic low level—in other words, the RS flip flop 7 is, from the above-mentioned point in time t6''', again placed in the above-mentioned "memory state" or "memory mode", respectively.

As results from FIG. 6, the RS flip flop 7 leaves the "memory state" or "memory mode", respectively, during which a signal OUTPUT DISABLE including the above-mentioned high level is output by the RS flip flop 7 at the signal line 3, as soon as the level of the input signal IN fed to the minus input of the third comparator 4c via the signal lines 2, 10 again lies below the level of the reference signal Ref 3 fed to the plus input of the third comparator 4c via the signal line 13 (since from then on the third comparator 4c again outputs a signal comprising the above-mentioned logic high level at the signal line 20 and the signal is fed to the R-input (Reset input) of the RS flip flop 7)—the RS flip flop 7 is then reset again (point in time t7''').

Thus, from the above-mentioned point in time tref4>''' until the above-mentioned point in time t7''', the total output comparator is disabled or locked, respectively, although the level of the input signal IN input into the threshold circuit arrangement 1 illustrated in FIG. 2 via the signal line 2 is, during the—relatively short—period t_out''', above the level of the reference signal Ref 2 input into the threshold circuit arrangement 1 via the signal line 12.

The total output comparator output signal OUT output by the total output comparator thus always includes the above-mentioned logic low level (deactivated output signal state) with the signal course illustrated in FIG. 6.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A threshold circuit arrangement comprising:
 a comparator circuit configured to compare an input signal with a predetermined threshold and, depending on the result of the comparison, adapting an output signal to change its state; and
 a threshold circuit configured to prevent the change of state of the output signal in the case of predetermined forms of the input signal, the circuit comprising:
  a flip flop providing a disable signal at an output, wherein the change of state of the output signal is prevented as a function of state of the disable signal;
  a first comparator having an output coupled to a first input of the flip flop;
  a second comparator having an output coupled to a second input of the flip flop;

the input signal coupled to an input of the second comparator, to an input of a third comparator, and to an input of a fourth comparator;

a signal representing the predetermined threshold coupled to an input of the third comparator; and an integrator having an input coupled between outputs of the third and fourth comparators via an addition element and an output coupled to an input of the first comparator.

2. The threshold circuit arrangement according to claim 1, wherein the threshold circuit is configured such that the change of state is prevented as a function of the rate of the signal rise or signal fall of the input signal.

3. The threshold circuit arrangement according to claim 1, wherein the threshold circuit is configured such that the change of state is prevented as a function of the duration during which the level of the input signal exceeds or under-runs the predetermined threshold.

4. The threshold circuit arrangement according to claim 1, wherein the threshold circuit is designed such that the change of state is prevented as a function of the amount by which the level of the input signal exceeds or under-runs the predetermined threshold.

5. The threshold circuit arrangement according to claim 1, wherein the flip flop is an RS flip flop.

6. The threshold circuit arrangement according to claim 1, wherein the integrator outputs an output signal by which the first comparator is triggered.

7. The threshold circuit arrangement according to claim 1, wherein the first comparator outputs an output signal by which the first input of a flip flop is triggered.

8. The threshold circuit arrangement according to claim 7, wherein the first input of the flip flop is a Set input of the flip flop.

9. The threshold circuit arrangement according to claim 1, wherein the second comparator outputs an output signal by which the second input of the flip flop is triggered.

10. The threshold circuit arrangement according to claim 9, wherein the second input of the flip flop is a Reset input of the flip flop.

11. The threshold circuit arrangement according to claim 1, wherein the threshold circuit is fed, in addition to a signal representing the predetermined threshold, with a signal representing a further threshold.

12. The threshold circuit arrangement according to claim 11, wherein the signal representing the further threshold is fed to an input of the second comparator.

13. The threshold circuit arrangement according to claim 11, wherein a signal representing an additional threshold is additionally fed to the threshold circuit.

14. The threshold circuit arrangement according to claim 1, wherein the signal representing the additional threshold is fed to an input of the third comparator.

15. The threshold circuit arrangement according to claim 1, wherein the signal representing the predetermined threshold is fed to an input of the fourth comparator.

16. The threshold circuit arrangement according to claim 15, wherein the fourth comparator and the third comparator each output an output signal, and wherein a signal generated by the additional element from the output signals of the fourth comparator and of the third comparator is used for triggering the integrator.

* * * * *